(12) United States Patent
Morita et al.

(10) Patent No.: US 10,149,393 B2
(45) Date of Patent: Dec. 4, 2018

(54) BURNING METHOD

(71) Applicant: Konica Minolta, Inc., Chiyoda-ku, Tokyo (JP)

(72) Inventors: Sayaka Morita, Gamagori (JP); Keita Saito, Toyokawa (JP); Dai Suwama, Hachioji (JP); Midori Shimomura, Hino (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 0 days.

(21) Appl. No.: 14/742,030

(22) Filed: Jun. 17, 2015

(65) Prior Publication Data

US 2015/0382477 A1 Dec. 31, 2015

(30) Foreign Application Priority Data

Jun. 28, 2014 (JP) .................................. 2014-133419

(51) Int. Cl.
H05K 3/12 (2006.01)

(52) U.S. Cl.
CPC .......... *H05K 3/1283* (2013.01); *H05K 3/125* (2013.01); *H05K 2203/0143* (2013.01); *H05K 2203/0278* (2013.01); *H05K 2203/1131* (2013.01); *H05K 2203/1476* (2013.01)

(58) Field of Classification Search
CPC ................. H05K 3/1291; H05K 3/125; H05K 2203/1126

See application file for complete search history.

(56) References Cited

U.S. PATENT DOCUMENTS

| | | | | |
|---|---|---|---|---|
| 5,496,433 A | * | 3/1996 | Miyashita | B29C 43/203 100/316 |
| 2009/0277007 A1 | * | 11/2009 | Maijala | H05K 3/1266 29/851 |
| 2012/0261049 A1 | * | 10/2012 | Weber | B29C 63/0065 156/64 |

FOREIGN PATENT DOCUMENTS

| | | |
|---|---|---|
| JP | 5-269777 A | 10/1993 |
| JP | 7-156119 A | 6/1995 |
| JP | 2003-39417 A | 2/2003 |
| JP | 2005-177710 A | 7/2005 |
| JP | 2006-202879 A | 8/2006 |
| JP | 2010-21470 A | 1/2010 |
| JP | 2010-087069 A | 4/2010 |

(Continued)

OTHER PUBLICATIONS

Office Action (Notification of Reasons for Refusal) dated Apr. 21, 2016, by the Japanese Patent Office in corresponding Japanese Patent Application No. 2014-133419, and an English Translation of the Office Action. (9 pages).

(Continued)

*Primary Examiner* — Dah-Wei D. Yuan
*Assistant Examiner* — Kristen A Dagenais-Englehart
(74) *Attorney, Agent, or Firm* — Buchanan Ingersoll & Rooney PC

(57) ABSTRACT

There is provided a burning method of burning, on a base member, a precursor in which conductive particles are dispersed in a dispersion medium, and the burning method includes: a first pressurization step of pressurizing the precursor heated to a burning temperature or above; and a second pressurization step of pressurizing, after the first pressurization step, the precursor with a pressurization force higher than a pressurization force in the first pressurization step.

5 Claims, 3 Drawing Sheets

(56) References Cited

FOREIGN PATENT DOCUMENTS

| | | | |
|---|---|---|---|
| JP | 2010087069 A | * | 4/2010 |
| JP | 2010087069 A | * | 4/2010 |
| JP | 2012-009546 A | | 1/2012 |

OTHER PUBLICATIONS

Office Action (Decision of Final Rejection) dated Sep. 29, 2016 issued by the Japanese Patent Office in corresponding Japanese Patent Application No. 2014-133419, and English language translation of Office Action (7 pages).

* cited by examiner

BURNING METHOD

This application is based on Japanese Patent Application No. 2014-133419 filed on Jun. 28, 2014, the contents of which are hereby incorporated by reference.

BACKGROUND OF THE INVENTION

Field of the Invention

The present invention relates to a burning method of burning a precursor in which conductive particles are dispersed.

Description of the Related Art

Conventionally, as a method of forming a conductive pattern on a base member by application of printing technology, printed electronics is utilized. In the burning of a metal ink in printed electronics, a dispersion medium that disperses metal particles and a dispersion agent that is adhered so as to coat the metal particles are removed. Then, with the metal particles in contact with each other, at a temperature lower than the melting temperature of the metal, substance movement occurs between the metal particles.

However, the dispersion agent has a function as a spacer in order to prevent the conductive particles stored from making contact with each other, and thus the space is left after the decomposition and removal of the dispersion agent. Hence, as shown in FIG. 6, voids are produced in the burned metal ink. The production of such voids may cause the denseness to be lowered such that the conductivity and strength are lowered.

Hence, in order to sinter the metal particles to develop the patterning wiring strength and conductivity, it is effective to achieve densification between the particles and between the particles and the base member by pressurization. Although the burning can be performed by heating without pressurization, in this case, sufficient conductivity may not be developed due to lack of densification.

In order to cope with this problem, for example, Japanese Unexamined Patent Application Publication No. 2005-177710 proposes a method (conventional method A) of performing pressurization with a pressurization member after burning to assist densification. On the other hand, a method (conventional method B) of performing densification by pressurization while drying a dispersion medium before burning to prevent the disturbance of a pattern is also proposed.

However, in the case of the conventional method A described above, since the densification is performed by pressurization after the burning, it is difficult to achieve sufficient densification. Since it is necessary to heat the burned conductive member again to a melting level, a large amount of heating energy is disadvantageously needed. Moreover, in the case of the conventional method B described above, a large amount of heating energy is needed to dry the dispersion medium, and furthermore, depending on the amount of dispersion medium or variations in the energy, it is difficult to perform the burning and reliably dry the dispersion medium.

In view of the foregoing problems, the present invention has an object to provide a burning method that easily realizes densification without need of a large amount of heating energy while reducing the disturbance of a pattern.

SUMMARY OF THE INVENTION

According to the present invention, there is provided a burning method of burning, on a base member, a precursor in which conductive particles are dispersed in a dispersion medium, the burning method including: a first pressurization step of pressurizing the precursor heated to a burning temperature or above; and a second pressurization step of pressurizing, after the first pressurization step, the precursor with a pressurization force higher than a pressurization force in the first pressurization step.

More specifically, in the method described above, in the first pressurization step, a pressure may be applied with a pressurization member in contact with the precursor, and the burning method may further include a non-pressurization step of providing, between completion of the first pressurization step and start of the second pressurization step, a period during which the pressurization member is not in contact with the precursor.

More specifically, in the method described above, in the first pressurization step, the pressurization member may be heated to the burning temperature or above, and the precursor may be heated to the burning temperature or above.

Furthermore, more specifically, in the method described above, in the first pressurization step, a ratio of a height of the precursor after the pressurization to a height of the precursor before the pressurization may be equal to or more than 0.2 but equal to or less than 0.9.

More specifically, in the method described above, in the first pressurization step, pressurization may be performed with a first pressurization member in contact with the precursor, and in the second pressurization step, pressurization may be performed with a second pressurization member whose hardness is higher than the first pressurization member in contact with the precursor.

DESCRIPTION OF PREFERRED EMBODIMENTS

An embodiment of the present invention will be described below with reference to drawings.

Figure 1:
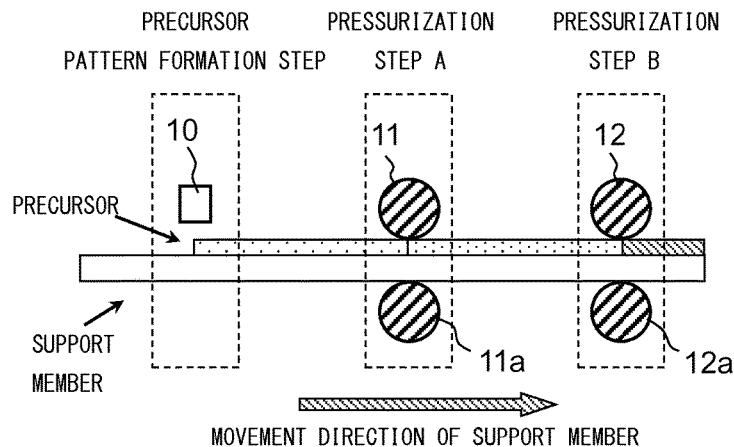
FIG. 1 A diagram schematically showing the configuration of a burning device according to the present embodiment.

FIG. 1 is a diagram schematically showing the configuration of a burning device 1 that performs a burning method according to the present embodiment. The burning device 1 is a device that burns a precursor on a support member (base member), and includes a precursor pattern formation unit 10, a first pressurization unit 11 and a second pressurization unit 12. The precursor is a dispersion solution that contains conductive particulates and a dispersion agent. The burning device 1 also includes an unillustrated transport unit (for example, a unit that transports the support member by utilization of the rotation of a roller) that transports the support member from the left side (upstream side) to the right side (downstream side) in FIG. 1.

The precursor pattern formation unit 10 is a unit that forms, on the support member, the pattern (precursor pattern) of the precursor in which the conductive particulates are dispersed. The conductive particulates are particles that develop conductivity through a burning step, and may be the particles of a single metal such as gold, silver, copper, aluminum, platinum, palladium, iridium, tungsten, nickel, tantalum, lead or zinc or the particles of an alloy or may be the particles of an oxidized metal such as copper oxide which is reduced in the burning step. In the precursor, a plurality of types of conductive particulates may be mixed.

The average primary particle diameter of the conductive particulates preferably falls within a range of 1 nm to 10 µm, and more preferably falls within a range of 10 nm to 100 nm. In the precursor, conductive particulates having different particle diameters may be mixed. Examples of the dispersion medium of the precursor include polar dispersion media such as water and ethylene glycol and non-polar dispersion media such as tetradecane. The type of dispersion agent of the precursor can be selected as necessary according to the conductive particulates, the dispersion medium and the support member that are adopted; for example, an ionic organic molecule or the like can be selected.

As a method of forming the precursor pattern, a general dispersion liquid arrangement method in printed electronics can be applied. Specific examples of the method described above include an inkjet, a wet electrophotographic method, screen printing, intaglio printing and letterpress printing.

The support member may be a thick rigid base member or may be a thin film-shaped or sheet-shaped base member. In the case of the film-shaped or sheet-shaped base member, it is easy to cope with R to R (roll-to-roll).

Examples of the material of the support member include polymer materials having high heat resistance such as glass and polyimide. For example, when burning is performed at room temperature, there is no restriction on this, and a material having low heat resistance can also be used. For example, a rubber material such as a silicone robber that is high in thermal expansion and thermal contraction and that is deformed significantly in a heating burning step, PET that is low in heat resistance and the like can also be used. Various types of support members such as a support member to which a material reactive with the precursor is previously added and a support member formed with a plurality of different layers can be adopted. On the support member, a pattern shape such as a conductive pattern or an insulating pattern may be previously formed.

The first pressurization unit 11 and the second pressurization unit 12 are provided on the downstream side with respect to the precursor pattern formation unit 10, and are units that perform a pressurization step which is a step of pressurizing the precursor heated to a burning temperature or above. A pressurization step A is performed by the first pressurization unit 11, and a pressurization step B is performed by the second pressurization unit 12.

The pressurization step B is assumed to be performed after the pressurization step A. In the present embodiment, the second pressurization unit 12 is provided on the downstream side with respect to the first pressurization unit 11, and the pressurization step B is performed after the pressurization step A is performed.

By these pressurization steps, it is possible to pressurize the precursor while making the burning proceed. The method (burning method) of heating the precursor to the burning temperature or above can be selected as necessary according to the precursor or the support member.

As the burning method, a method of using a heating pressurization member (a member used both for heating and pressurization) is preferable. In this case, the heating pressurization member previously heated to the burning temperature or above makes contact with the precursor, heat is transferred from the heating pressurization member to the precursor and thus the precursor is heated to the burning temperature or above.

Specific examples of the burning method include a method of putting the precursor into a furnace heated to the burning temperature or above, a method of performing heating with high-frequency waves, laser or light and a method using plasma. The burning method is not limited to these methods. When metal oxide particulates are used, burning is performed in a reducing atmosphere, and thus it is possible to develop conductivity.

As long as the precursor heated to the burning temperature on the support member or above can be pressurized, the specific form of the pressurization units 11 and 12 is not limited. As the pressurization units 11 and 12, for example, a press type, a roller type, a form of pressing a blade member, a belt type of arranging a pressurization member in a belt or the like can be adopted. In particular, when the roller type or the belt type is adopted, it is easy to incorporate the pressurization units 11 and 12 into a R-to-R system.

The pressurization units 11 and 12 may be formed with a plurality of layers. For example, the pressurization units 11 and 12 may be formed such that fluorination treatment or the like is performed on the surface of metal or rubber, the surface energy of the support member is lowered and thus releasability is enhanced. On the surface on the opposite side of the pressurization units 11 and 12 through the support member, a pressurization support member is preferably provided in order to prevent the support member from being deformed.

In the present embodiment, as shown in FIG. 1, as the pressurization units 11 and 12, the roller type is adopted, and pressurization support members 11a and 12a are also provided. The pressurization units 11 and 12 are assumed to be heated to the burning temperature or above, and function as the heating pressurization member described above.

More specifically, the first pressurization unit 11 functions as the heating pressurization member that makes contact with the precursor in the pressurization step A to apply heat and pressure. In other words, the first pressurization unit 11 presses, from above, the precursor on the support member supported from below by the pressurization support member 11a, and thereby pressurizes the precursor.

The second pressurization unit 12 functions as the heating pressurization member that makes contact with the precursor in the pressurization step B to apply heat and pressure. In other words, the second pressurization unit 12 presses, from above, the precursor on the support member supported from below by the pressurization support member 12a, and thereby pressurizes the precursor.

A surface pressure (pressurization force) by the second pressurization unit 12 in the pressurization step B is set higher than a surface pressure by the first pressurization unit 11 in the pressurization step A. The pressurization step A and the pressurization step B will be described in more detail below.

[Pressurization Step A]

In the pressurization step A, which is the most upstream pressurization step, the surface pressure received by the precursor preferably falls within a range of 0.1 kPa to 0.1

MPa, and more preferably falls within a range of 1 kPa to 10 kPa. When the surface pressure is lower than the surface pressure described above, the first pressurization unit 11 is prevented from making uniform contact with the precursor, and thus insufficient densification is more likely to be performed. By contrast, when the surface pressure is higher than the surface pressure described above, the pattern of the precursor is more likely to be disturbed by pressurization.

In the pressurization step A, the surface after an extra amount of liquid in the precursor is removed may be pressurized by the first pressurization unit 11. By the removal of the liquid, it is possible to more sufficiently prevent the disturbance of the pattern at the time of pressurization. Examples of the method of removing the liquid include a method of providing an airflow, a method of performing heating, a method of performing depressurization and a method of sucking the liquid by capillarity.

The flowability of the precursor is lowered by the progress of the burning, and thus it is impossible to sufficiently obtain the effect of the pressurization. Hence, in the step of removing the liquid described above, it is preferable to give consideration to prevention of burning of the precursor. In particular, when the liquid is removed by heating, it is preferable to perform heating at a temperature lower than the burning temperature or perform heating for such a short period of time that the burning does not proceed.

Figure 2:
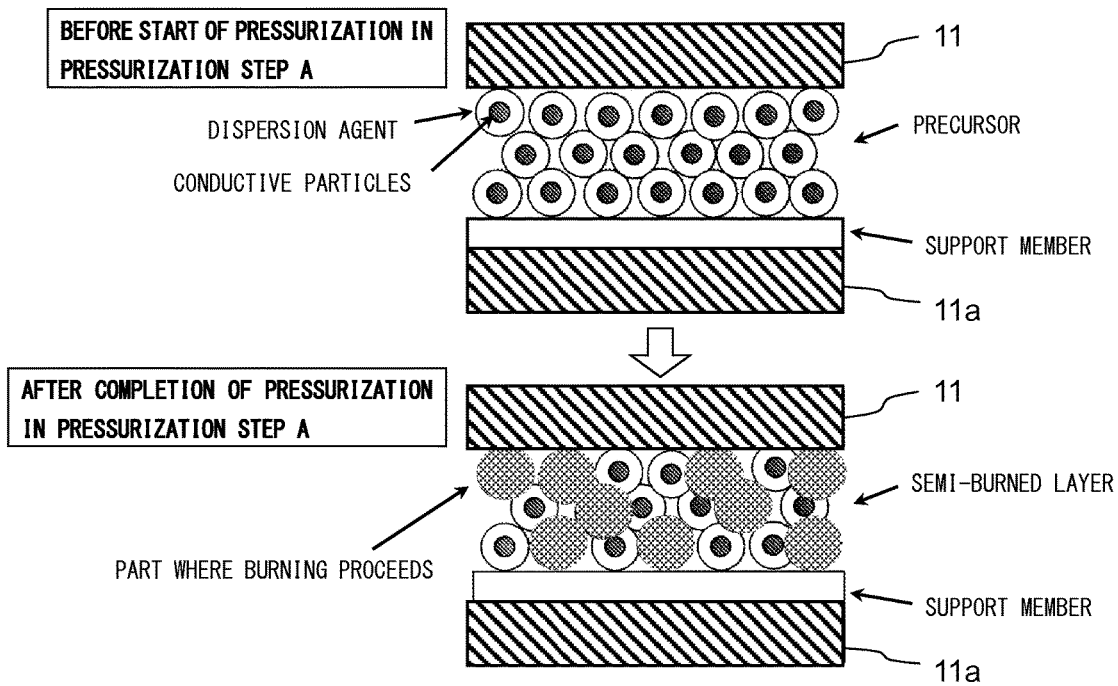
FIG. 2 A schematic cross-sectional view of a precursor pattern before the start of pressurization and after the completion of pressurization in a pressurization step A.

FIG. 2 shows a schematic cross-sectional view of the precursor pattern before the start of the pressurization and after the completion of the pressurization in the pressurization step A. In the pressurization step A, the pressurization is performed with such a surface pressure that the precursor pattern is prevented from being deformed, and thus the precursor pattern is formed into a semi-burned layer. In the semi-burned layer, the conductive particulates before sintering and the initial sintered member are mixed, and its resistance to the deformation of the pattern caused by the pressing is increased but the flowability is still left; in other words, the semi-burned layer is a layer in a semi-burned state.

A heating temperature and a heating time in the pressurization step A can be set as necessary according to, for example, the specifications of the support member, the pressurization unit and a heating unit such that the precursor is brought into the semi-burned state described above. Whether the precursor is changed from a solution state or a dry state to the semi-burned state can be determined from a variation in the height of the precursor caused by the volatilization of the dispersion medium or the dispersion agent.

Hence, when it is assumed that the height of the precursor pattern before the pressurization step A is performed is $h_A$, and that the height of the precursor pattern after the pressurization step A is performed but before the pressurization step B is performed is $h_{AB}$, and the individual conditions (such as the heating temperature, the heating time and the setting of the surface pressure) of the pressurization step A are set such that the height $h_{AB}$ is appropriately lower than the height $h_A$, the pressurization step B is easily performed in the semi-burned state. The height $h_A$ is measured between the precursor pattern formation step and the pressurization step A, and the height $h_{AB}$ is measured between the completion of the pressurization step A and the pressurization step B.

For example, a sample that is previously prepared for the setting of conditions is used to measure a height from the support member to the upper surface of the precursor with a laser displacement meter or the like, and thus the height of the precursor pattern at each timing is measured. In the pressurization step A, the individual conditions are set such that a ratio ($h_{AB}/h_A$) of the height $h_{AB}$ to the height $h_A$ falls within a range of 0.2 to 0.9, and thus the densification of the pattern in the pressurization step B is more effectively performed. In particular, the individual conditions in the pressurization step A are more preferably set such that the ratio ($h_{AB}/h_A$) falls within a range of 0.5 to 0.9.

As the method of making the ratio ($h_{AB}/h_A$) of the height $h_{AB}$ to the height $h_A$ fall within the predetermined range (or of adjusting the ratio to be a predetermined value), a method of appropriately determining the conditions of the pressurization step A based on a test and the like, feedback control for adjusting the conditions as necessary or the like may be utilized. For example, while the height $h_A$ and the height $h_{AB}$ are being monitored, when the value of $h_{AB}/h_A$ deviates from the predetermined range, the surface pressure or the like may be adjusted such that the deviation does not occur.

In the burning of the precursor, the dispersion medium or the dispersion agent is an inhibitor. In the pressurization step A, since the first pressurization unit 11 is brought into contact with the precursor in which the dispersion medium is left, the dispersion medium is removed by being adhered to the first pressurization unit 11, with the result that the dispersion medium is effectively removed as compared with a case where the dispersion medium is volatilized by heating.

On the other hand, in the pressurization step A, the volatilization of the dispersion medium or the dispersion agent is induced by heating. In the pressurization step A, since the first pressurization unit 11 keeps contact with the precursor, a path along which the dispersion medium is volatilized may not be sufficiently obtained. However, in the present embodiment, between the completion of the pressurization step A and the start of the pressurization step B, a period during which neither the pressurization unit 11 nor the pressurization unit 12 are in contact with the precursor is provided. In this way, the upper side of the precursor is opened, and thus it is possible to facilitate the volatilization of the dispersion medium or the dispersion agent.

[Pressurization Step B]

Figure 3:
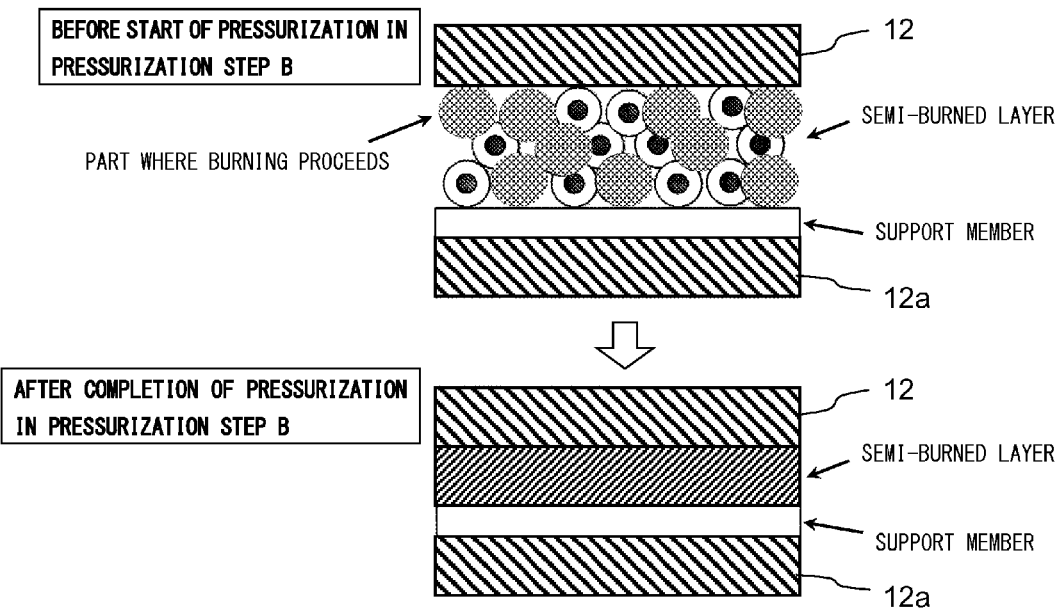
FIG. 3 A schematic cross-sectional view of the precursor pattern before the start of pressurization and after the completion of pressurization in a pressurization step B.

The pressurization step B will then be described. FIG. 3 shows a schematic cross-sectional view of the precursor pattern before the start of pressurization and after the completion of pressurization in the pressurization step B. In the pressurization step B, in order for sufficient adhesive strength and conductivity to be developed, while the precursor pattern is being pressed with a pressure higher than that in the pressurization step A, the burning is performed, with the result that it is possible to obtain a dense conductive layer shown in FIG. 3.

The surface pressure received by the precursor in the pressurization step B is preferably higher than the surface pressure in the pressurization step A, and in particular, the surface pressure is preferably twice or more higher than that in the pressurization step A. The upper limit of the surface pressure in the pressurization step B is preferably about 50 MPa, and furthermore, is more preferably about 1 MPa. When the surface pressure is excessively low as compared with these conditions, necessary pressurization is not performed, and insufficient densification of the precursor is easily performed whereas when the surface pressure is excessively high, the disturbance of the precursor pattern and the irreversible damage of the support member are easily produced.

In the pressurization step B, a plurality of stages may be provided. The surface pressures of the stages in the pressurization step may be set equal to each other or may be set different from each other. When the surface pressures are set different from each other, the surface pressures can be finely changed such that both the reduction of the disturbance of the pattern and the densification are achieved, with the result that it is possible to more effectively perform the densification of the pattern. A pressurization step whose surface pressure is higher than that in the preceding step is provided in the subsequent step, and thus it is possible to more effectively densify the semi-burned layer in which the burning proceeds.

Figure 4:
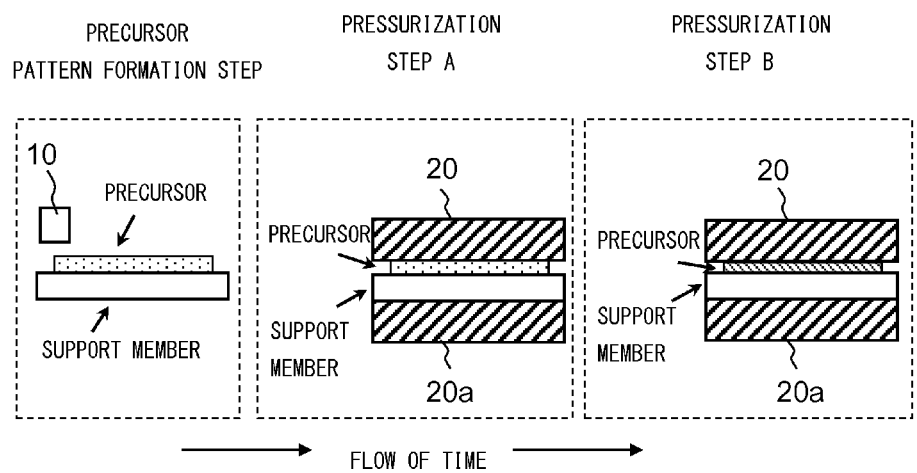
FIG. 4 An illustrative diagram when the same pressurization unit and the like are used both in the pressurization steps.

The pressurization step A and the pressurization step B may be realized by changing the surface pressure of the same pressurization unit with time. The same pressurization support member may be used both in the pressurization step A and in the pressurization step B or a plurality of pressurization support members may be provided. FIG. 4 shows the state of each step when the same pressurization unit 20 and the same pressurization support member 20a are used both in the pressurization step A and in the pressurization step B. In this case, the support member is fixed onto the pressurization support member 20a, and the surface pressure of the pressurization unit 20 is changed, with the result that it is possible to appropriately perform the pressurization step A and the pressurization step B.

The first pressurization unit 11 may differ from the second pressurization unit 12 in hardness. The surface pressures of the pressurization step A and the pressurization step B may be adjusted by changing the hardness of each of the pressurization units. For example, the hardness of the first pressurization unit 11 is relatively lowered, and thus it is possible to realize a low surface pressure while flexibly corresponding to the pattern shape in the pressurization step A whereas the hardness of the second pressurization unit 12 is increased as compared with the hardness of the first pressurization unit 11, and thus it is possible to easily obtain a high surface pressure in the pressurization step B.

In printed electronics, when the smoothness of the pattern, that is, the denseness around the surface, is low, its impedance is disadvantageously degraded. With respect to this point, the hardness of the second pressurization unit 12 is increased so as to be close to a rigid member, and thus it is possible to perform the densification and to easily obtain the smoothness of the pattern surface.

While the pressurization step B is being performed, a difference in the transport speed between the support members may be produced. The speed difference is produced, and thus a force in the horizontal direction (a direction parallel to the surface of the support member) is applied to the semi-burned layer, and the particles are easily moved, with the result that it is possible to effectively perform the densification. The heating temperature and the heating time in the pressurization step B can be set as necessary according to, for example, the specifications of the support member, the pressurization unit and the heating unit such that the precursor is appropriately brought into the burned state.

[Performance Evaluation]

The burning device 1 having the configuration shown in FIG. 1 was used to form a pattern of a conductive layer, and performance evaluation was performed thereon in example 1. Specifically, a pattern formation method, conditions and the like in example 1 were as follows. In example 1, as the pressurization step B using the second pressurization unit 12, pressurization steps B1, B2 and B3 in three stages were provided in this order.

Conductive particulates: silver particulates having an average primary particle diameter of 7 nm Dispersion medium: solution obtained by mixing water and ethylene glycol (polar solvent)

Support member: PET sheet (thickness of 100 μm)

Pressurization step A: as the pressurization unit, a robber roller (fluorine-coated) was used, the surface pressure was set at 0.01 MPa and the heating temperature was set at 90° C.

Pressurization step B1: as the pressurization unit, a metal roller (fluorine-coated) was used, the surface pressure was set at 0.01 MPa and the heating temperature was set at 150° C.

Pressurization step B2: as the pressurization unit, a metal roller (fluorine-coated) was used, the surface pressure was set at 0.01 MPa and the heating temperature was set at 150° C.

Pressurization step B3: as the pressurization unit, a metal roller (fluorine-coated) was used, the surface pressure was set at 0.01 MPa and the heating temperature was set at 150° C.

In example 1, on the support member, a precursor pattern having a width of 100 μm was formed by an inkjet method. Then, a liquid left on the surface of the precursor was removed by being heated to 50° C., and in the pressurization step A, pressurization and heating were performed from the upper surface of the precursor. By previously measuring the height of the precursor while changing the conditions of the pressurization step, the conditions of the pressurization and the heating in the pressurization step A were set such that the ratio ($h_{AB}/h_A$) of the height described previously was 0.8. Then, on the precursor pattern subjected to the pressurization step A, the pressurization and the heating in the pressurization step B were further performed, and a product obtained in this way was used as an evaluation sample.

For comparative evaluation on the evaluation sample in example 1, a comparative sample 1 and a comparative sample 2 were prepared. The comparative sample 1 was obtained by performing burning at a temperature of 150° C. for 30 minutes without pressurization and thereafter performing the pressurization and the heating under the same conditions as in the pressurization step B. The comparative sample 2 was obtained by performing burning at a temperature of 150° C. for 30 minutes without pressurization. Evaluation on the samples was performed with a microscope having a magnification of 100 by observing the surface and the cross-sectional shape of the samples.

In comparative sample 1, the densification around the surface was performed to some degree but the densification on the side of the support member was not sufficient. In comparative sample 2, projections and recesses in the surface were removed but voids were left over the entire area and the densification was not sufficient. On the other hand, in the evaluation sample of example 1, it was observed that sufficient densification was performed from the surface to the side of the support member.

[Others]

As described above, the burning method according to the present embodiment is the method of burning, on the base member, the precursor in which the conductive particles are dispersed in the dispersion medium. In the burning method, as the step of pressurizing the precursor heated to the burning temperature or above, at least the pressurization step A (the first pressurization step) and the pressurization step B (the second pressurization step) are performed, and after the pressurization step A is performed, the pressurization step B in which its pressurization force is higher than that that in the pressurization step A is performed.

In the burning method, at the same time when the heating and burning processing is performed on the precursor, the pressurization step of pressurizing the precursor heated to the burning temperature at that time or above is performed. Hence, in the burning method, as compared with a case where the pressurization is performed after the burning to perform densification, it is easy to realize sufficient densification.

Moreover, in the burning method, as compared with a case where the burned conductive member is heated again to a melting level, a large amount of heating energy is not needed. Furthermore, in the burning method, since the pressurization step A is performed and thereafter the pressurization step in which its pressurization force is increased is performed, it is relatively easy to realize the densification while reducing the disturbance of the pattern.

The present invention is not limited at all to the embodiment described above, and various variations are possible without departing from its intension. For example, as a variation of the embodiment described above, in a series of steps performed with the burning device 1, one or a plurality of pressurization steps (which are referred to as a pressurization step C) other than the pressurization step A and the pressurization step B may be provided.

Figure 5:
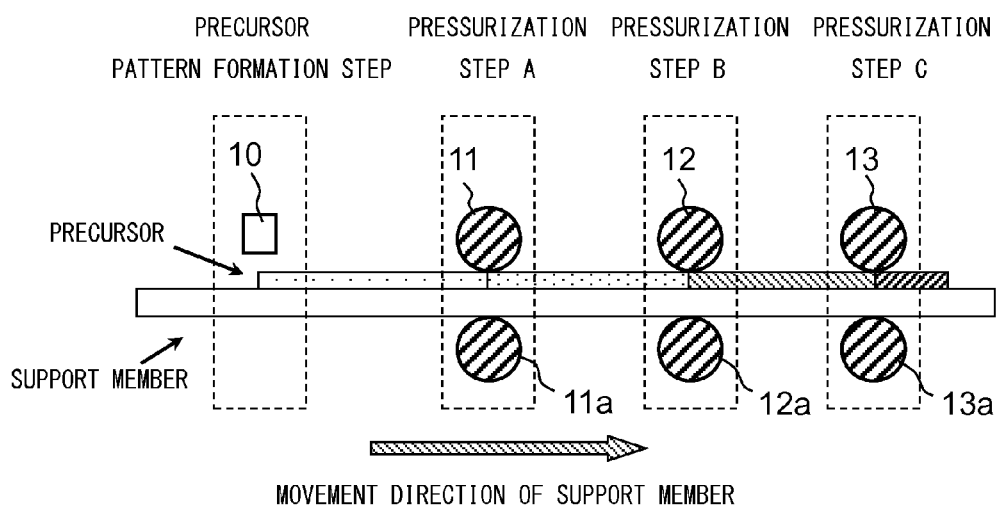
FIG. 5 An illustrative diagram when a pressurization step C is provided.
Figure 6:
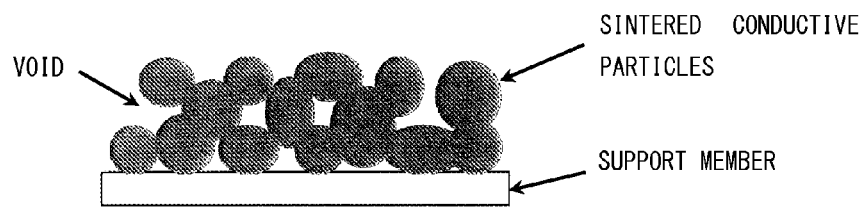
FIG. 6 An illustrative diagram on a conventional burning technology.

FIG. 5 schematically shows, as an example, the configuration of the burning device 1 in which the pressurization step C is provided after the pressurization step B. In the burning device 1 of the example shown in FIG. 5, a third pressurization unit 13 for performing the pressurization step C and the corresponding pressurization support member 13*a* are provided, and pressurization processing C can be performed as in the pressurization step A and the pressurization step B. The precursor is preferably heated to the burning temperature or above when at least the pressurization step A and the pressurization step B are performed, and may not be heated to the burning temperature or above when the pressurization step C is performed.

The conductive pattern obtained with the burning device of the present embodiment can be utilized in various applications such as the electrode portions of electronic devices such as a printed wiring board, a membrane switch and a display.

What is claimed is:

1. A burning method of burning, on a base member, a precursor in which conductive particles are dispersed in a dispersion medium, the burning method comprising:
    a first pressurization step of pressurizing the precursor while heating the precursor to a burning temperature of the precursor or above such that the precursor is brought into a semi-burned state in which conductive particulates before sintering and an initial sintered member are mixed, wherein in the first pressurization step, a pressure is applied with a pressurization member in contact with the precursor, to volatilize by heating the dispersion medium out of the precursor;
    a second pressurization step of heating the precursor while pressurizing, after the first pressurization step, the precursor with a pressurization force higher than a pressurization force in the first pressurization step so as to burn the precursor in the semi-burned state, and
    a non-pressurization step of providing, between completion of the first pressurization step and start of the second pressurization step, a period during which the pressurization member is not in contact with the precursor, wherein the volatilization of the dispersion medium out of the precursor is facilitated.

2. The burning method according to claim 1, wherein in the first pressurization step, the pressurization member is heated to the burning temperature or above, and the precursor is heated to the burning temperature or above.

3. The burning method according to claim 1, wherein in the first pressurization step, a ratio of a height of the precursor after the pressurization to a height of the precursor before the pressurization is equal to or more than 0.2 but equal to or less than 0.9.

4. The burning method according to claim 1, wherein the pressurization member is a first pressurization member, and in the second pressurization step, pressurization is performed with a second pressurization member whose hardness is higher than the first pressurization member.

5. The burning method according to claim 1, further comprising:
    a precursor pattern formation step of forming a pattern of the precursor on the base member before the first and second pressurization steps.

* * * * *